(12) United States Patent
Hong et al.

(10) Patent No.: US 7,656,708 B2
(45) Date of Patent: Feb. 2, 2010

(54) MEMORY ARCHITECTURE WITH ADVANCED MAIN-BITLINE PARTITIONING CIRCUITRY FOR ENHANCED ERASE/PROGRAM/VERIFY OPERATIONS

(75) Inventors: Stanley Hong, San Jose, CA (US); Jami Wang, Campbell, CA (US); Alan Chen, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 280 days.

(21) Appl. No.: 11/871,881

(22) Filed: Oct. 12, 2007

(65) Prior Publication Data

US 2008/0031075 A1 Feb. 7, 2008

Related U.S. Application Data

(63) Continuation of application No. 11/179,243, filed on Jul. 12, 2005, now Pat. No. 7,295,485.

(51) Int. Cl.
*G11C 11/34* (2006.01)
(52) U.S. Cl. ............... 365/185.13; 365/185.11; 365/230.03
(58) Field of Classification Search ............ 365/185.13, 365/185.11, 230.03
See application file for complete search history.

(56) References Cited

U.S. PATENT DOCUMENTS

| | | | |
|---|---|---|---|
| 5,361,233 A | 11/1994 | Kotani | |
| 5,457,647 A | 10/1995 | McClure | |
| 5,687,132 A | 11/1997 | Rao | |
| 5,943,284 A | 8/1999 | Mizuno et al. | |
| 6,178,134 B1 * | 1/2001 | Evans et al. | ............ 365/230.03 |
| 6,465,818 B1 | 10/2002 | Kato | |
| 6,519,180 B2 | 2/2003 | Tran et al. | |
| 6,917,541 B2 | 7/2005 | Shimbayashi et al. | |
| 7,295,485 B2 | 11/2007 | Hong et al. | |

FOREIGN PATENT DOCUMENTS

| | | |
|---|---|---|
| EP | 1274096 A2 | 1/2003 |
| WO | WO-2007/008325 A2 | 1/2007 |

OTHER PUBLICATIONS

"U.S. Appl. No. 11/179,243, Amendment and Response filed Jun. 11, 2007 to Non-Final Office Action mailed Mar. 27, 2007", 13 pgs.
"U.S. Appl. No. 11/179,243, Non-Final Office Action mailed Mar. 27, 2007", 7 pgs.
"U.S. Appl. No. 11/179,243, Notice of Allowance mailed Jul. 13, 2007", 6 pgs.
"European Application Serial No. 06784817.6, Communication pursuant to Rules 161 and 162 EPC dated Feb. 25, 2008", 2 pgs.

(Continued)

*Primary Examiner*—Son Dinh
*Assistant Examiner*—Nam Nguyen
(74) *Attorney, Agent, or Firm*—Schwegman, Lundberg & Woessner, P.A.

(57) ABSTRACT

The present invention provides a solution for long master bit lines in a large capacity memory device. A master bit line is partitioned by at least one switching transistor placed on the master bit line.

30 Claims, 4 Drawing Sheets

OTHER PUBLICATIONS

"European Application Serial No. 06784817.6, Supplementary European Search Report Nov. 28, 2008", 6 pgs.

"International Application Serial No. PCT/US2006/022946, International Preliminary Examination Report mailed Apr. 1, 2008", 8 pgs.

"International Application Serial No. PCT/US2006/022946, International Search Report mailed Sep. 25, 2007", 2 pgs.

"International Application Serial No. PCT/US2006/022946, Written Opinion mailed Sep. 25, 2007", 5 pgs.

Sprogis, E. J, "Segmented Bit Line Architecture for Open and Folded Bit Line Cells", *IBM Technical Disclosure Bulletin*, vol. 32, No. 3A, [online]. [retrieved Jan. 5, 2009]. Retrieved from the Internet: <https://www.delphion.com/tdbs/tdb?order=89A+61421>, (Aug. 1989), 363-365.

\* cited by examiner

US 7,656,708 B2

MEMORY ARCHITECTURE WITH ADVANCED MAIN-BITLINE PARTITIONING CIRCUITRY FOR ENHANCED ERASE/PROGRAM/VERIFY OPERATIONS

CROSS-REFERENCE TO RELATED APPLICATION

This application is a continuation of U.S. patent application Ser. No. 11/179,243, filed Jul. 12, 2005.

TECHNICAL FIELD

The present invention relates to semiconductor memories, and in particular, programmable or flash memories.

BACKGROUND ART

Memory devices such as EEPROM, flash, and dual bit (such as MONOS EEPROM) or multi-bit memory include a plurality of nonvolatile memory cells. Each memory may include multiple sub-arrays of columns and rows of memory cells. Each memory cell may have a control gate, a floating gate to store charges, a drain and a source, and the ability to erase, program, and read data in a single memory cell or operate on a predetermined block of memory cells. A memory device includes an array of memory cells for the storage of data, a control circuit for handling the input, output, and storage of data, and a reference cell array for reading the logic value of memory cells. The EEPROM or flash memory is used as a built-in memory within products such as microcomputers, personal digital assistants, phones, external storage devices, and within a variety of other products.

A row of memory cells is typically addressed using a word line. A column of memory cells has at least one conductive bit line selectively coupled to a corresponding memory cell in a column for transferring data to single or multiple memory cells. In one example, a column of memory cells may also be coupled to additional bit lines to transfer data from at least one selected memory cell to another memory cell. In another example, for SRAM, local bit lines are typically arranged in bit line pairs, with one bit line being the complement of the other.

A flash MOS transistor includes a source, a drain, a floating gate, and a control gate connected to a word line (WL). Generally, all of the memory cells in a word line row must be selected. A decoder would select one row by selecting a word line while all other word lines are unselected. The drains of the memory cells in a column are connected to bit lines, and the sources of the cells in one row are connected together. Generally, the word line decoder supplies one word line with a select voltage, while applying an override voltage to all other unselected word lines within a block.

Many memory devices address a single memory cell. Alternately, as shown in FIG. 1, a MONOS EEPROM structure has a dual-bit arrangement. Dual bit memory cell 29 has a control gate ($CG_m$) 22 and floating gate memory cells 25a, 25b. The control gate 22 is coupled to a left memory cell 25a and a right memory cell 25b. Common to both right and left memory cells 25a, 25b is a bit line ($BL_m$) 23. With a bit line 23 connected to two memory cells 25a, 25b, both cells may be programmed and read in a single program and read operation. The right and left memory cells 25a, 25b, are correspondingly coupled to word line devices 24a, 24b.

Various voltages are applied to a memory cell 25a, 25b to program and erase the memory cell as a logic 1 or a logic 0 value respectively. A typical flash memory cell 25a, 25b is programmed by inducing a hot electron injection from the channel region into the floating gate of the MOS transistor. Erasure of a memory cell 25a, 25b is typically performed using Fowler-Nordheim tunneling operation between the floating gate and the source, or between the floating gate and the substrate. Either programming or erasure of a flash cell results in a non-volatile threshold voltage in a programmed or erased cell.

When applying programming voltages, word line devices 24a, 24b are used to create a circuit path to the floating gate of a memory cell 25a, 25b. Various voltages applied to a control gate 22 in combination with bit line 23 and word line 21 are used to program or erase the right and left components 25a, 25b. Other memory cells are similarly programmed or erased, such as $CG_{m-1}$, $CG_{m+1}$ when actuating $BL_{m-1}$ 28 and $BL_{m+1}$ 29. EEPROM memory cells are arranged in an array of rows and columns and may be connected in various configurations. Generally, the conductive interconnections of control gates $CG_{m-1}$, $CG_m$, $CG_{m+1}$, . . . and bit lines $BL_{m-1}$, $BL_m$, $BL_{m+1}$, . . . are arranged in columns. Word line 21 is coupled to a plurality of memory cells by interconnects that are usually arranged in rows.

Voltages are normally applied via local bit lines, word lines and control gates to read and/or program a memory transistor. Each of the two memory cells 25a, 25b are connected to a bit line ($BL_m$) 23. Word lines are normally deactivated, or held at a low voltage, for example at or below 0.7 volts. To program a target memory transistor 25a, an associated word line (WL) 21 is activated, for example at or above 1 volt, which allows select transistors 24a, 24b to be in a conducting state. An associated control gate ($CG_m$) 22 is activated or selected while adjacent control gates ($CG_{m+1}$) and ($CG_{m-1}$) are held in an over-ride (inactive) state. A high voltage, such as 4.5 volts, is applied to an associated bit line ($BL_m$) 23, and a low voltage, 0 volts, is applied to one adjacent bit line ($BL_{m-1}$) 28. Select transistor 24a is in a conducting state, providing program current to flow to memory transistor 25a. An inhibit voltage, such as 1 volt, is applied to another adjacent bit line ($BL_{m+1}$) 29 and select transistor 24b is held in a non-conducting state, with no programming current applied to memory transistor 25b. Also, with control gates ($CG_{m+1}$) and ($CG_{m-1}$) held in an over-ride state, adjacent memory transistors 26b, 27a are not programmed.

An arrangement of memory cells within a memory device may include memory array partitions with local bit lines in close proximity to and coupled to each memory array partition. Master bit lines are correspondingly coupled to the local bit lines. Local bit lines add capacitance to the overall bit line layout, and so each local bit line will be coupled to the master bit line via decode circuitry, interface circuitry, or a transistor switch. Local select signals control the coupling of a local bit line to a master bit line. U.S. Pat. No. 5,457,647 to McClure describes a hierarchical or two-level bit line configuration such that a number of local bit lines are connected to a master bit line through interface circuitry. Local select signals, when set to the appropriate voltage level, couple a local bit line to the master bit line. Coupling or isolating a local bit line to/from a master bit line controls the overall bit line capacitance to improve the speed of the memory device.

FIG. 2 illustrates a prior art circuit 10 that may be used to erase, program, read, and verify a dual bit programmable memory array 20. A memory array 20 having rows and columns of memory cells may be a single array or an array segment that is a portion of a programmable memory device. A memory device may contain a plurality of memory array segments. Main bit lines 30 $MBL_0$-$MBL_n$ continuously run the entire length of a memory array device. Coupled to the memory array 20 are word lines 21 $WL_0$-$WL_n$, control gate lines 22 $CG_0$-$CG_n$, and local bit lines 23 $BL_0$-$BL_n$. A local bit line 70 is coupled to or isolated from a main bit line 30 by a local bit line select transistor 71 and a main bit line isolation transistor 31. A separate path is used to pass high-voltage to local bit lines 23 for an erase or program operation. Generally, two main bit lines 30 and one local bit line 23 are used to perform operations on a pair of memory cells. The two main bit lines 30 are used to sense or drive data from and to the memory cells, while the local bit line 23 is used to supply the proper bias voltage $V_{bl}$ to the memory cells. A main bit line 30 is normally isolated from a local bit line 70 when applying bias voltages to a memory cell in the memory array 20 by a main bit line isolation transistor 31. A voltage bias line 60 $V_{bl}$ may apply a bias voltage to the bit lines 23 by activating a voltage isolation transistor 61. Operations may be performed on memory cells in the memory array 20 by activating a plurality of select devices such as a select transistor 41 when activating a sense circuit 40, or a programming circuit 40.

When a bias voltage $V_{bl}$ is applied to a local bit line 70, the local bit line 70 must only carry enough current to program up to two memory bits in the memory array segment 20. However, the bias voltage line 60 must be capable of carrying enough current for all of the bits in the memory array segment 20. The width of the voltage bias line 60 must therefore be capable of carrying a high amount of current. The width of each voltage bias line 60 therefore becomes a critical factor for high-capacity high-density memory array.

Main bit lines 30 generally run the length of an entire memory device including running to multiple partitions within a memory device. Long bit lines present a larger capacitance to sense amplifiers so isolation devices and local bit line select devices must be included for every memory array segment. In many designs, local bit lines 70 are developed in one interconnect layer, with main bit lines 30 developed in another interconnect layer. Local bit lines 70 may be developed, for example, in polysilicon or in metal.

The capacitance of the overall bit line layout (main and local bit lines) is reduced by isolating the local bit lines 70 from the main bit lines 30. It is possible that the performance of a memory device may be improved by reducing the capacitance or leakage of the main bit lines.

SUMMARY

At least one switching transistor is placed in series on a main (or master) bit line so as to divide the main bit line into a plurality of main bit line (local) partitions. A plurality of memory cells are correspondingly coupled to local bit line partitions.

The invention may be practiced using a variety of memory technologies including single or multiple bit memory arrays.

The advantage of the present invention is to provide a means of improving the performance of a programmable memory device or to improve the performance of at least one memory array segment by reducing the length of a main bit line.

The present invention decreases the amount of time it takes to charge and discharge a main bit line, or apply bias voltages, for memory devices close or in physical proximity to the sense and program circuits because the associated capacitance of the main bit line is improved. In addition, main bit line leakage is reduced.

DETAILED DESCRIPTION

Figure 3:
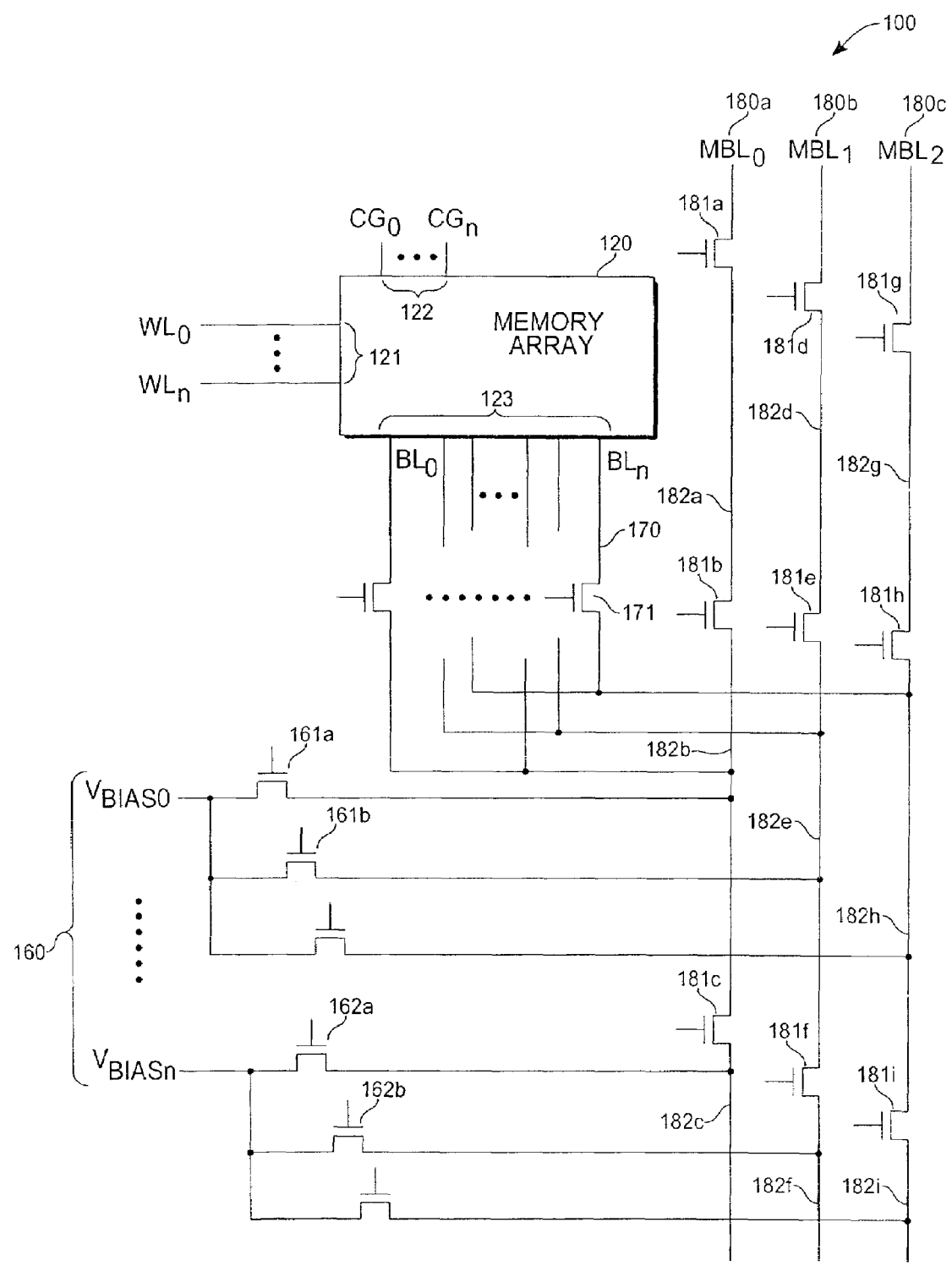
FIG. 3 is an exemplary embodiment of a partitioned main bit line.

The present invention provides a solution for long main bit lines, for example in a large capacity memory array. In one embodiment, as illustrated in FIG. 3, three main bit lines 180a-180c ($MBL_0$-$MBL_2$) are normally coupled from a page register (not shown) to a desired memory array segment 120. Corresponding main bit line transistor switches 181a-181i are placed in series along main bit lines 180a-180c, for example, dividing the main bit line into approximately equal segments or partitions. Each main bit line 180a-180c may be isolated by a single transistor switch. The spacing of the main bit line transistor switches 181a-181c placed in series along the main bit line may be chosen to match the size of a memory array segment or to provide a specific controlled capacitance value for partitions of the main bit line. The main bit line transistor switches 181a-181i are controlled to isolate or couple the main bit line partitions 182a-182i.

A dual bit programmable memory array segment 120 having rows and columns of memory cells may be a single array or an array segment that is a portion of a programmable memory device. Coupled to the memory array 120 are word lines 121 $WL_0$-$WL_n$, control gate lines 122 $CG_0$-$CG_n$, and local bit lines 123 $BL_0$-$BL_n$. Local bit lines 123 are coupled to main bit lines 180a-180c and may be selected by a decode circuit proximate to the memory array segment 120 being accessed. An exemplary local bit line 170 is coupled to or isolated from a main bit line 180c by a local bit line select transistor 171. At least one voltage bias line 160 may apply a bias voltage $V_{bias0}$-$V_{biasn}$ to the bit lines 123 by activating at least one of a plurality of voltage isolation transistors 161a, 161b, 162a, 162b.

In one embodiment, there are no isolation devices coupled between main bit lines 180a-180c and corresponding local bit lines 123. A bias voltage line 160 is isolated or coupled to the main bit line by a voltage isolation transistor 161a, 161b, 162a, 162b. The main bit line may then be used as a path for passing various bias voltages that may be used for an erase or program operation.

A bias voltage $V_{bias0}$-$V_{biasn}$ may be applied to at least one main bit line partition. Normally, a voltage isolation transistor 161a, 161b, 162a, 162b, couples a main bit line to a bias voltage 160 ($V_{bias0}$-$V_{biasn}$). Generally, each bias voltage $V_{bias0}$-$V_{biasn}$ is coupled to one voltage isolation transistor 161a, 161b, 162a, 162b per main bit line 180a-180c, and each main bit line 180a-180c may be coupled to one of a plurality of bias voltages.

Bias voltages 160 are applied to local bit lines 123 during an erase or program operation. Main bit line 180a may be divided into partitions 182a, 182b, 182c. When a bias voltage 160 is applied to a local bit line 123, the corresponding main bit line partition 182b also carries the bias voltage. With bias voltage $V_{bias}$ applied to a main bit line partition 182b, the main bit line transistor switches 181a-181c may be configured to provide the bias voltage $V_{bias}$ to other memory arrays (not shown), or may be configured to limit the application of the bias voltage $V_{bias}$ to a single main bit line partition 182b, or may be configured to also apply the bias voltage $V_{bias}$ to other main bit line partitions 182a, 182c.

In one embodiment, main bit line partition 182b that is isolated by main bit line transistor switches 181b and 181c may be discharged in a shorter period of time as a result of the main bit line partition 182b having a smaller capacitance in comparison to an entire main bit line. The smaller capacitance of a main bit line partition 182b reduces the time and power required to apply voltages to the array and reduces time and power to discharge voltages or sense data from the array. In another embodiment, when main bit line partition 182b is isolated from other portions of the main bit line 180a, the isolated partition (or combination of main bit line partitions) may be maintained at a predetermined voltage. For example, the entire main bit line 180a may be discharged and a main bit line partition 182b may be subsequently isolated from the rest of the main bit line 180a. A main bit line partition 182b may then be used to perform an operation on the memory array segment 120 using an applied bias voltage $V_{bias}$ or driving a signal that is isolated from the rest of the main bit line 180a without affecting other main bit line partitions 182a, 182c.

Figure 1:
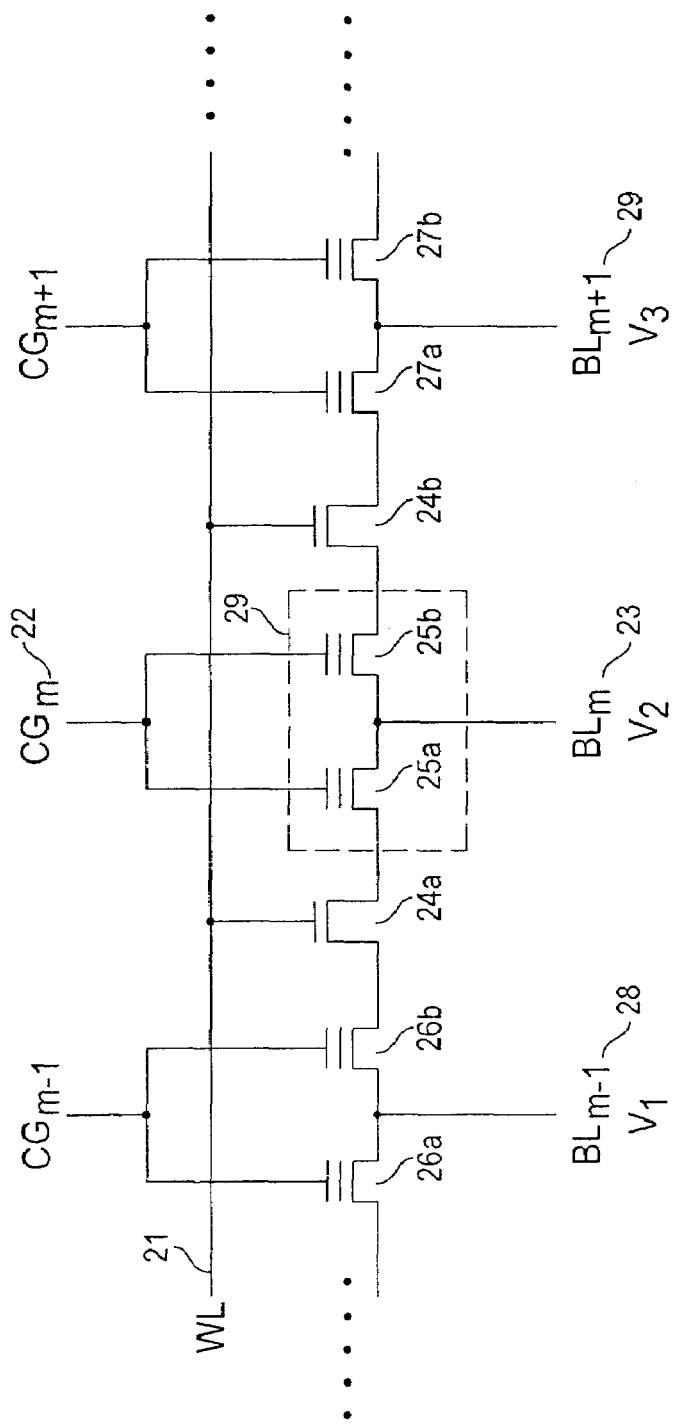
FIG. 1 illustrates a prior art MONOS EEPROM structure.
Figure 2:
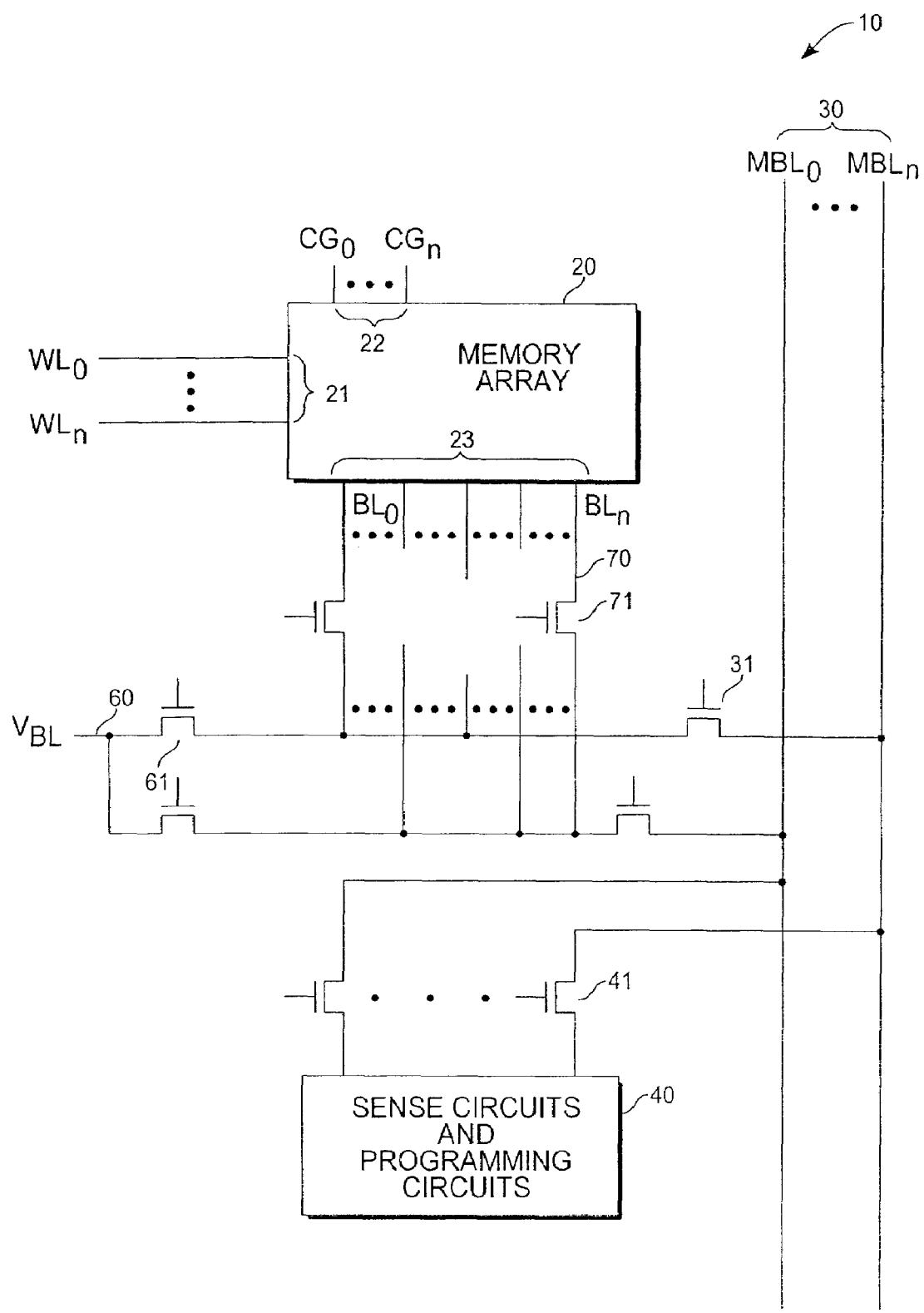
FIG. 2 illustrates a prior art circuit used to erase or program a memory cell in FIG. 1.

In one embodiment, three main bit lines 180a-180c containing at least one main bit line transistor switch 181a-181i and a plurality of main bit line partitions 182a-182i are used to perform operations on, for example, a pair of memory cells 25a, 25b (see FIG. 1) within a dual bit memory array segment 120. Two of the main bit lines 180b, 180c may be used to sense or drive data both to and from the memory cells 25a, 25b while a third main bit line 180a is used to apply a bias voltage to the memory cells 25a, 25b. The two main bit lines 180b, 180c that are used to sense or drive data to or from the memory cells 25a, 25b may pass data to/from a sense amplifier or driver concurrently with a bias voltage being applied to the third bit line 180a. Main bit line transistor switches 181a-181c that partition the main bit line 180a are configured so that the bias voltage that is applied to the desired memory cells is isolated to a single main bit line partition 182b. However, the transistor switches that partition the main bit line may also be configured so that the bias voltage is applied to multiple bit line partitions 182a, 182c.

In another embodiment, one or more main bit line partitions 182b, 182c are being discharged or pre-charged while a different main bit line partition 182a is being used to apply a bias voltage during an erase or program operation.

Isolating a main bit line partition 182b, or a coupled combination of main bit line partitions 182a, 182c, from the rest of the main bit line provides several advantages. First, the overall capacitance of the main bit line partition 182a is lower than the capacitance of the entire main bit line and improvements in speed or latency times may be realized. Additionally, the total bit line capacitance as seen by a sense circuit during a verify operation is not constant and depends upon the number of main bit line partitions that are activated. Second, having multiple main bit line partitions provides the opportunity to apply different voltages or different signals to different main bit line partitions 182a-182i. Also, different timing schemes may be applied to different bit line partitions 182a-182i. For example, the timing to apply a bias voltage may be shifted in comparison to other signals that are applied. Third, when the main bit lines 180a-180c are partitioned, a main bit line partition 182a-182i is electrically coupled to fewer transistor switches and has improved leakage characteristics.

In another embodiment, by dividing a main bit line 180a-180c into partitions or segments, the overall capacitance of the main bit line may be controlled. The main bit line capacitance may be reduced by using a smaller or a single main bit line partition 182a, 182b, 182c, to perform an operation. Controlling a main bit line 180a-180c to reduce capacitance allows faster charge or discharge times.

In an alternative embodiment, enabling all of the partition devices, for example enabling the transistor switches 181a-181c, for the first main bit line 180a, will have a higher capacitance. However, the main bit line, once charged, to 4.5 volts for example, will maintain enough charge to complete a program operation without the sustained use of a voltage driver throughout the entire program operation, and the voltage driver may be turned off before the program operation is complete. In this embodiment, the voltage driver is used only to pre-charge the main bit line for a program operation. In addition, the capacitance of each main bit line 180a-180c may also be controlled to store additional current for a programming operation by coupling additional corresponding main bit line partitions 182a-182i together.

Overall, power and time savings may be realized during a charge or pre-charge operation, and during programming by turning a voltage off during a portion of a programming cycle.

Figure 4:
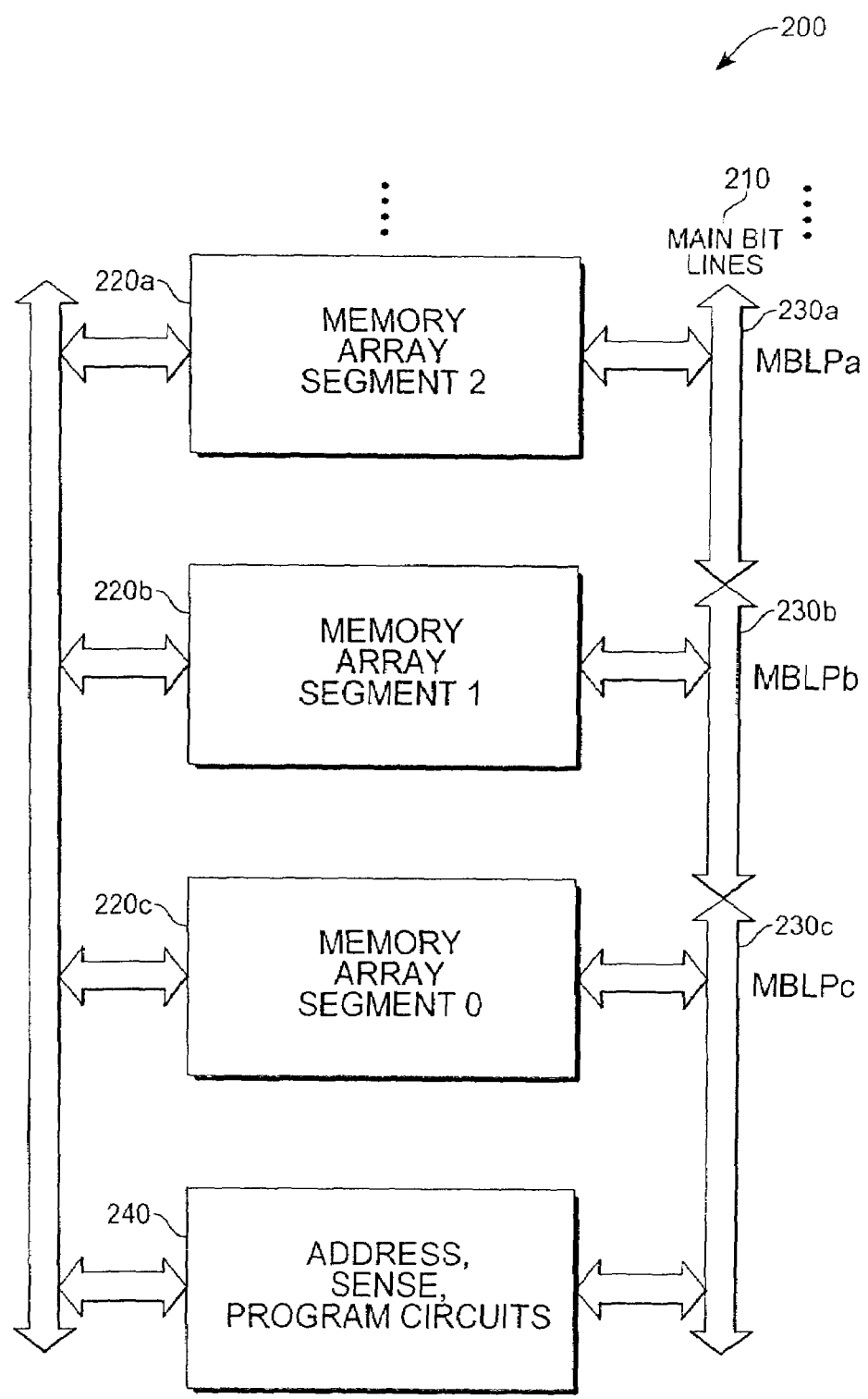
FIG. 4 is an exemplary embodiment of a memory device having the partitioned main bit line of FIG. 3 applied to a memory device having multiple memory array segments.

Referring to the exemplary embodiment in FIG. 4, memory device 200 contains multiple memory array segments 220a-220c that are coupled to address, sense, and program circuits 240. The memory segments 220a-220c are also coupled to main bit lines 210 that are divided into main bit line partitions 230a-230c. By dividing main bit lines 210 into main bit line partitions 230a-230c and using the main bit line partitions 230a-230c to apply bias voltages to the memory array, memory array segments 220a-220c that are closer to, for example sense circuits 240, may be operated at increased speeds. Access timings may be changed dependent upon the relative or proximate position of the targeted memory array segment 220a-220c or the number of main bit line partitions 230a-230c that have been activated during the memory operation. Memory array segments 220a-220c that are closer to a sense circuit 240 may access data faster resulting from increased performance of a shorter bit line path. Also, memory array segments 220a-220c that are physically closer to drive circuits 240 may be pre-charged and brought up to a desired voltage in a shorter period of time. A memory device may be configured to have at least one memory array segment 220a or main bit line partition 230c that operates faster, with lower access time and lower latency, than other memory array segments 220b-220c within a single memory device 200.

Using the main bit lines to apply bias voltages is also an efficient approach to reduce the size of an individual metal layer or to reduce the number of layers necessary to manufacture a high-capacity high-density memory array. For example, each partition may have its own set of devices located in proximity to each corresponding partition. In one embodiment, three metal layers may be used in the interconnect layout of a memory device. The first layer M1 may be formed to develop word lines. Also, another layer, such as M2, may be used to run the main bit lines. Another layer, for example M3, may be used to run control gate lines. A bit line select or decode circuit may be used to select local bit lines or to control main bit line partitions.

The present invention may be applied to various types of memory other than an exemplary EEPROM. In addition, a variety of configurations may be possible, such as having at least one transistor switch to couple or isolate a partition of the main bit line external to the die of the memory device, or using a main bit line partition to apply or carry a control signal instead of a data signal or bias voltage. It is to be understood that the above description is intended to be illustrative, and not restrictive. Those of skill in the art will recognize that the invention can be practiced with modification and alteration within the spirit and scope of the appended claims. Embodiment(s) of the invention so described may include a particular feature, structure, or characteristic, but not every embodiment necessarily includes the particular feature, structure, or characteristic described. Repeated use of the phrase "in one embodiment" does not necessarily refer to the same embodiment, although it may. Many other embodiments will be apparent to those of skill in the art upon reading and understanding the above description. The description is thus to be regarded as illustrative instead of limiting. The scope of the invention should, therefore, be determined with reference to the appended claims, along with the full scope of equivalents to which said claims are entitled.

What is claimed is:

1. A memory device comprising:
   a plurality of programmable memory cells;
   a plurality of local bit lines correspondingly coupled to the plurality of memory cells;
   a main bit line coupled to at least one local bit line and a sense amplifier circuit, the sense amplifier circuit not being required to be located on both ends of the main bit line; and
   at least one switching transistor placed on the main bit line, dividing the main bit line into a plurality of main bit line partitions.

2. The memory device of claim 1 wherein the plurality of programmable memory cells are arranged as a plurality of memory cell array segments.

3. The memory device of claim 1 wherein the plurality of programmable memory cells are dual bit memory cell structures or multi-bit cells.

4. The memory device of claim 1 wherein all of the main bit line partitions are approximately equal in length.

5. The memory device of claim 1 wherein the switching transistors are coupled to control circuits capable of selectively isolating or selectively coupling at least one main bit line partition from or to at least one other main bit line partition.

6. The memory device of claim 1 wherein at least one main bit line partition is coupled to at least one local bit line by a local bit line select transistor.

7. The memory device of claim 1 wherein at least one main bit line partition is coupled to a voltage bias line.

8. The memory device of claim 7 wherein at least one other main bit line partition is simultaneously coupled to a sense circuit.

9. The memory device of claim 7 wherein the at least one main bit line partition is further coupled to at least one programmable memory cell.

10. The memory device of claim 1 wherein the memory device further comprises a plurality of main bit lines.

11. The memory device of claim 1 wherein the at least one switching transistor is coupled to a control circuit that is capable of changing the timing parameters of the memory device.

12. The memory device of claim 11 wherein a single main bit line partition is selectively coupled to a memory cell.

13. A method of programming a memory cell comprising:
    controlling at least one switching transistor serially coupled to and dividing a main bit line, the main bit line requiring only a single sense amplifier for reading the one or more memory cells;
    isolating the main bit line into a plurality of main bit line partitions; and
    applying a bias voltage to at least one main bit line partition.

14. A method of programming a memory cell of claim 13 further comprising: selectively coupling at least one main bit line partition to at least one local bit line coupled to at least one memory cell.

15. The method of programming a memory cell of claim 13 wherein applying the bias voltage to the at least one main bit line partition is performed to erase at least one memory cell.

16. The method of programming a memory cell of claim 13 wherein applying the bias voltage to the at least one main bit line partition is performed to write a logic value to at least one memory cell.

17. The method of programming a memory cell of claim 13 wherein applying the bias voltage to the at least one main bit line partition is performed to program the memory cell while simultaneously using at least one other main bit line partition to drive a data value.

18. The method of programming a memory cell of claim 13 wherein applying the bias voltage to the at least one main bit line partition is used to complete a programming operation of at least one memory cell without the sustained use of a bias voltage driver.

19. The method of programming a memory cell of claim 13 wherein the applied bias voltage to the at least one main bit line partition is discharged while simultaneously using at least one other main bit line partition to drive a data value.

20. The method of programming a memory cell of claim 13 further comprising changing at least one memory access timing parameter based on a number of the main bit line partitions that are selected during a memory cell operation.

21. The method of programming a memory cell of claim 13 further comprising:
    changing at least one memory access timing parameter based on the proximity of the memory cell to other memory circuits.

22. A memory array segment comprising:
    a plurality of memory cells arranged into columns and rows;
    a plurality of local bit lines coupled to the plurality of memory cells;
    at least one main bit line coupled to at least one local bit line and a sense amplifier circuit, the sense amplifier circuit not being required to be located on both ends of the at least one main bit line; and
    at least one switching transistor dividing the at least one main bit line into a plurality of main bit line partitions.

23. The memory array segment of claim 22 wherein the memory cells are dual bit structures or multi-bit cells.

24. The memory array segment of claim 22 wherein the at least one switching transistor is coupled to control circuits to selectively isolate or selectively couple at least one main bit line partition from or to at least one other main bit line partition.

25. The memory array segment of claim 22 wherein at least one main bit line partition is coupled to at least one local bit line by a local bit line select transistor.

26. The memory array segment of claim 22 wherein at least one main bit line partition is coupled to a voltage bias line.

27. The memory array segment of claim 22 wherein at least one other main bit line partition is simultaneously coupled to a sense circuit.

28. The memory array segment of claim 22 wherein the memory array segment further comprises a plurality of main bit lines.

29. The memory array segment of claim 22 wherein the at least one switching transistor is coupled to control circuits that are capable of changing the memory array segment access timing parameters.

30. The memory array segment of claim 29 wherein a single main bit line partition is selectively coupled to a memory cell.

* * * * *